(12) United States Patent
Donahue

(10) Patent No.: US 10,912,992 B2
(45) Date of Patent: Feb. 9, 2021

(54) ERGONOMIC HANDHELD INPUT/OUTPUT DEVICE

(71) Applicant: Mark P. Donahue, Broomfield, CO (US)

(72) Inventor: Mark P. Donahue, Broomfield, CO (US)

( * ) Notice: Subject to any disclaimer, the term of this patent is extended or adjusted under 35 U.S.C. 154(b) by 19 days.

(21) Appl. No.: 16/247,820

(22) Filed: Jan. 15, 2019

(65) Prior Publication Data
US 2020/0222798 A1 Jul. 16, 2020

(51) Int. Cl.
| | |
|---|---|
| *A63F 13/24* | (2014.01) |
| *H03K 17/967* | (2006.01) |
| *G06F 3/02* | (2006.01) |
| *G06F 3/0354* | (2013.01) |
| *G06F 3/01* | (2006.01) |

(52) U.S. Cl.
CPC .............. *A63F 13/24* (2014.09); *G06F 3/017* (2013.01); *G06F 3/0213* (2013.01); *G06F 3/03547* (2013.01); *H03K 17/967* (2013.01)

(58) Field of Classification Search
None
See application file for complete search history.

(56) References Cited

U.S. PATENT DOCUMENTS

| | | |
|---|---|---|
| 6,264,574 B1 | 7/2001 | Nelson et al. |
| 6,802,662 B1 | 10/2004 | Cheng et al. |
| 7,654,901 B2 | 2/2010 | Breving |
| 8,449,417 B2 | 5/2013 | Bevier et al. |
| 8,576,171 B2 * | 11/2013 | Grant ...................... G06F 3/016 345/163 |
| 2003/0197682 A1 * | 10/2003 | Huang ................ G06F 3/03543 345/163 |
| 2007/0060392 A1 | 3/2007 | Sullivan |
| 2010/0265179 A1 * | 10/2010 | Ram ..................... G06F 3/0227 345/163 |
| 2010/0331092 A1 | 12/2010 | Nakajima |
| 2014/0375566 A1 * | 12/2014 | Tagge ................... G06F 3/0233 345/168 |

(Continued)

FOREIGN PATENT DOCUMENTS

KR    20110094915 A  *  8/2011

OTHER PUBLICATIONS

EPO Machine Translation of KR-20110094915-A.*

(Continued)

*Primary Examiner* — James S. McClellan
*Assistant Examiner* — Peter J Iannuzzi
(74) *Attorney, Agent, or Firm* — Sheridan Ross P.C.

(57) ABSTRACT

Embodiments of the present disclosure are directed to a conically-shaped, handheld device that can be used as a computer system input/output device, a gaming system controller, a remote control for various household electronic devices, an interface to a home network, etc. Inputs through the device can be received from various buttons, switches, panels, etc. disposed along a surface of the device as well as sensors embedded within the device. Outputs can be made through speakers, displays, and other transducers also disposed along the surface of the device or embedded with therein. Furthermore, the overall shape and size of the device can be adapted to an individual user through pneumatic bladders disposed within the device.

20 Claims, 7 Drawing Sheets

(56) References Cited

U.S. PATENT DOCUMENTS

2015/0290076 A1   10/2015  Hobbs
2020/0057511 A1*  2/2020  Lee ..................... G06F 3/03547

OTHER PUBLICATIONS

International Search Report and Written Opinion for International (PCT) Patent Application No. PCT/US2020/012658, dated Mar. 31, 2020, 14 pages.

* cited by examiner

ERGONOMIC HANDHELD INPUT/OUTPUT DEVICE

FIELD OF THE DISCLOSURE

Embodiments of the present disclosure relate generally to methods and systems for an input/output device and more particularly to an ergonomically adaptable, handheld input/output device.

BACKGROUND

Input devices or controllers for computing systems, gaming systems, and various other electronic devices take a variety of forms. For example, handheld gaming system controllers typically have one or more joysticks or similar devices and a number of buttons allowing a player to interact with the gaming system. Similarly, a keyboard and mouse or similar pointing device are typically used to interface and interact with a computer system. All of these devices, and others, have been adapted in various ways in efforts to make them more ergonomic, i.e., easier and more comfortable for a human user to handle. However, there is an ongoing need for improved ergonomic input/output devices suitable for interfacing with various types of computing systems, gaming systems, and/or various other electronic devices. Furthermore, there is an ongoing need for such devices that are adaptable or customizable to individual users, e.g., based on personal preferences, hand size, etc.

BRIEF SUMMARY

Embodiments of the disclosure provide systems and methods for an ergonomically adaptable input/output device suitable for interfacing with computing systems, gaming systems, and/or various other electronic devices. More specifically, embodiments of the present disclosure are directed to a conically-shaped, handheld device that can be used as a computer system input/output device, a gaming system controller, a QWERTY keyboard, a remote control for various household electronic devices, an interface to a home network, etc. Inputs through the device can be received from various buttons, switches, panels, etc. disposed along a surface of the device as well as sensors embedded within the device. Outputs can be made through speakers, displays, and other transducers also disposed alone the surface of the device or embedded with therein. Furthermore, the overall shape and size of the device can be adapted to an individual user through pneumatic bladders disposed within the device.

According to one embodiment, an input/output device for a computer system can comprise a substantially circular base portion, a substantially conical-shaped enclosure coupled with and extending from the base portion, the base portion and enclosure together forming an elliptical, hemi-spherically shaped structure, one or more input devices disposed on a surface of the enclosure, and an interface coupled with each of the one or more input devices. The interface can communicate input signals from the one or more input devices to the computer system.

The one or more input devices can comprise a numeric keypad, a QWERTY keyboard, a touchpad mouse, a miniature joystick, etc. One or more output devices can be disposed on a surface of the enclosure at an end of the elliptical, hemi-spherical structure opposite the base portion, the interface further coupled with each of the one or more output devices and communicating output signals from the computer system to the output devices. The one or more output devices can comprise a speaker or other device. The interface can comprise a wired interface such as a Universal Serial Bus (USB) interface. In other cases, the interface can comprise a wireless communications interface. In such cases, the input/output device can further comprise a processor coupled with the wireless communication interface, the one or more input devices, and the one or more output devices and a memory coupled with and readable by the processor. The memory can store therein a set of instructions which, when executed by the processor, causes the processor to pair with the computer system via the wireless communication interface.

In some cases, the input/output device can further comprise one or more inflatable air bladders disposed along an interior of the enclosure and a change in a volume of air within the air bladders can change at least one of a size or shape of the elliptical, hemi-spherically shaped structure. Additionally, or alternatively, one or more inflatable air bladders can be disposed along the base portion of the input/output device and a change in a volume of air within the air bladders can change a shape of the base portion.

According to another embodiment, a hand-held controller for a computer gaming system can comprise a substantially circular base portion, a substantially conical-shaped enclosure coupled with and extending from the base portion, the base portion and enclosure together forming an elliptical, hemi-spherically shaped structure. A plurality of input devices can be disposed on a surface of the enclosure. The plurality of input devices can comprise any of a plurality of buttons, a mini joystick, a pressure sensor, a motion sensor, etc. One or more output devices can be disposed on a surface of the enclosure at an end of the elliptical, hemi-spherical structure opposite the base portion. The one or more output devices can comprise any of a speaker, a haptic transducer, one or more lights, a display, etc.

An interface can be coupled with each input device of the plurality of input devices and each of the one or more output devices. The interface can communicate input signals from the one or more input devices to the computer gaming system and output signals from the computer gaming system to the one or more output devices. In some cases, one or more inflatable air bladders can be disposed along an interior of the enclosure and a change in a volume of air within the air bladders can change at least one of a size or shape of the elliptical, hemi-spherically shaped structure. Additionally, or alternatively, one or more inflatable air bladders can be disposed along an outside of the base portion and a change in a volume of air within the air bladders changes a shape of the base portion.

Figure 1:
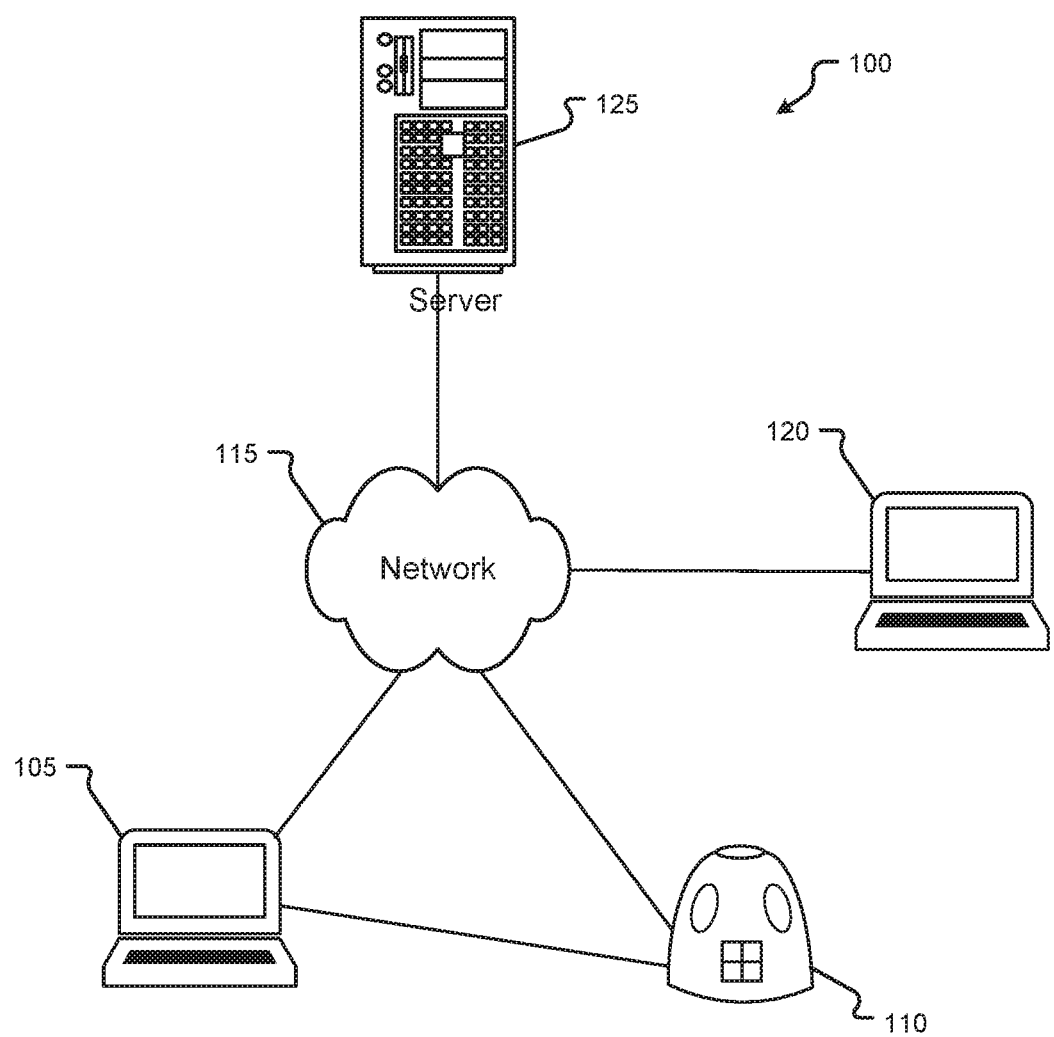
FIG. 1 is a block diagram illustrating elements of an exemplary environment in which embodiments of the present disclosure may be implemented.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the second reference label.

DETAILED DESCRIPTION

In the following description, for the purposes of explanation, numerous specific details are set forth in order to provide a thorough understanding of various embodiments disclosed herein. It will be apparent, however, to one skilled in the art that various embodiments of the present disclosure may be practiced without some of these specific details. The ensuing description provides exemplary embodiments only, and is not intended to limit the scope or applicability of the disclosure. Furthermore, to avoid unnecessarily obscuring the present disclosure, the preceding description omits a number of known structures and devices. This omission is not to be construed as a limitation of the scopes of the claims. Rather, the ensuing description of the exemplary embodiments will provide those skilled in the art with an enabling description for implementing an exemplary embodiment. It should however be appreciated that the present disclosure may be practiced in a variety of ways beyond the specific detail set forth herein.

While the exemplary aspects, embodiments, and/or configurations illustrated herein show the various components of the system collocated, certain components of the system can be located remotely, at distant portions of a distributed network, such as a Local-Area Network (LAN) and/or Wide-Area Network (WAN) such as the Internet, or within a dedicated system. Thus, it should be appreciated, that the components of the system can be combined in to one or more devices or collocated on a particular node of a distributed network, such as an analog and/or digital telecommunications network, a packet-switch network, or a circuit-switched network. It will be appreciated from the following description, and for reasons of computational efficiency, that the components of the system can be arranged at any location within a distributed network of components without affecting the operation of the system.

Furthermore, it should be appreciated that the various links connecting the elements can be wired or wireless links, or any combination thereof, or any other known or later developed element(s) that is capable of supplying and/or communicating data to and from the connected elements. These wired or wireless links can also be secure links and may be capable of communicating encrypted information. Transmission media used as links, for example, can be any suitable carrier for electrical signals, including coaxial cables, copper wire and fiber optics, and may take the form of acoustic or light waves, such as those generated during radio-wave and infra-red data communications.

As used herein, the phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising," "including," and "having" can be used interchangeably.

The term "automatic" and variations thereof, as used herein, refers to any process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

The term "computer-readable medium" as used herein refers to any tangible storage and/or transmission medium that participate in providing instructions to a processor for execution. Such a medium may take many forms, including but not limited to, non-volatile media, volatile media, and transmission media. Non-volatile media includes, for example, Non-Volatile Random-Access Memory (NVRAM), or magnetic or optical disks. Volatile media includes dynamic memory, such as main memory. Common forms of computer-readable media include, for example, a floppy disk, a flexible disk, hard disk, magnetic tape, or any other magnetic medium, magneto-optical medium, a Compact Disk Read-Only Memory (CD-ROM), any other optical medium, punch cards, paper tape, any other physical medium with patterns of holes, a Random-Access Memory (RAM), a Programmable Read-Only Memory (PROM), and Erasable Programmable Read-Only Memory (EPROM), a Flash-EPROM, a solid state medium like a memory card, any other memory chip or cartridge, a carrier wave as described hereinafter, or any other medium from which a computer can read. A digital file attachment to e-mail or other self-contained information archive or set of archives is considered a distribution medium equivalent to a tangible storage medium. When the computer-readable media is configured as a database, it is to be understood that the database may be any type of database, such as relational, hierarchical, object-oriented, and/or the like. Accordingly, the disclosure is considered to include a tangible storage medium or distribution medium and prior art-recognized equivalents and successor media, in which the software implementations of the present disclosure are stored.

A "computer readable signal" medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, Radio Frequency (RF), etc., or any suitable combination of the foregoing.

The terms "determine," "calculate," and "compute," and variations thereof, as used herein, are used interchangeably and include any type of methodology, process, mathematical operation or technique.

It shall be understood that the term "means" as used herein shall be given its broadest possible interpretation in accordance with 35 U.S.C., Section 112, Paragraph 6. Accordingly, a claim incorporating the term "means" shall cover all structures, materials, or acts set forth herein, and all of the equivalents thereof. Further, the structures, materials or acts and the equivalents thereof shall include all those described in the summary of the disclosure, brief description of the drawings, detailed description, abstract, and claims themselves.

Aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Any combination of one or more computer readable medium(s) may be utilized. The computer readable medium may be a computer readable signal medium or a computer readable storage medium.

In yet another embodiment, the systems and methods of this disclosure can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as Programmable Logic Device (PLD), Programmable Logic Array (PLA), Field Programmable Gate Array (FPGA), Programmable Array Logic (PAL), special purpose computer, any comparable means, or the like. In general, any device(s) or means capable of implementing the methodology illustrated herein can be used to implement the various aspects of this disclosure. Exemplary hardware that can be used for the disclosed embodiments, configurations, and aspects includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing can also be constructed to implement the methods described herein.

Examples of the processors as described herein may include, but are not limited to, at least one of Qualcomm® Snapdragon® 800 and 801, Qualcomm® Snapdragon® 610 and 615 with 4G LTE Integration and 64-bit computing, Apple® A7 processor with 64-bit architecture, Apple® M7 motion coprocessors, Samsung® Exynos® series, the Intel® Core™ family of processors, the Intel® Xeon® family of processors, the Intel® Atom™ family of processors, the Intel Itanium® family of processors, Intel® Core® i5-4670K and i7-4770K 22 nm Haswell, Intel® Core® i5-3570K 22 nm Ivy Bridge, the AMD® FX™ family of processors, AMD® FX-4300, FX-6300, and FX-8350 32 nm Vishera, AMD® Kaveri processors, Texas Instruments® Jacinto C6000™ automotive infotainment processors, Texas Instruments® OMAP™ automotive-grade mobile processors, ARM® Cortex™-M processors, ARM® Cortex-A and ARM926EJ-S™ processors, other industry-equivalent processors, and may perform computational functions using any known or future-developed standard, instruction set, libraries, and/or architecture.

In yet another embodiment, the disclosed methods may be readily implemented in conjunction with software using object or object-oriented software development environments that provide portable source code that can be used on a variety of computer or workstation platforms. Alternatively, the disclosed system may be implemented partially or fully in hardware using standard logic circuits or Very Large-Scale Integration (VLSI) design. Whether software or hardware is used to implement the systems in accordance with this disclosure is dependent on the speed and/or efficiency requirements of the system, the particular function, and the particular software or hardware systems or microprocessor or microcomputer systems being utilized.

In yet another embodiment, the disclosed methods may be partially implemented in software that can be stored on a storage medium, executed on programmed general-purpose computer with the cooperation of a controller and memory, a special purpose computer, a microprocessor, or the like. In these instances, the systems and methods of this disclosure can be implemented as program embedded on personal computer such as an applet, JAVA® or Common Gateway Interface (CGI) script, as a resource residing on a server or computer workstation, as a routine embedded in a dedicated measurement system, system component, or the like. The system can also be implemented by physically incorporating the system and/or method into a software and/or hardware system.

Although the present disclosure describes components and functions implemented in the aspects, embodiments, and/or configurations with reference to particular standards and protocols, the aspects, embodiments, and/or configurations are not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

Various additional details of embodiments of the present disclosure will be described below with reference to the figures. While the flowcharts will be discussed and illustrated in relation to a particular sequence of events, it should be appreciated that changes, additions, and omissions to this sequence can occur without materially affecting the operation of the disclosed embodiments, configuration, and aspects.

FIG. 1 is a block diagram illustrating elements of an exemplary environment in which embodiments of the present disclosure may be implemented. More specifically, this example illustrates an environment 100 including a computing device 105 such as a laptop, desktop, or other personal computer, a gaming system, a tablet computer, etc. In some implementations, the computing device can be any of a wide variety of other electronic devices including, but not limited to, a smart television, a television Set-Top Box and/or Digital Video Recorder (DVR), a network interface device such as a "stick," "cube," or similar device, for example, coupled with a television, etc. The system 100 can also include an input-output device 110 coupled with the computing device 105 through any of a variety of wired or wireless means as known in the art. Generally speaking, the input/output device 110 allows a user to interface and interact with the computing device 105 to provide control and other input signals to the computing device 105 based on the user's manipulations of the input/output device 110 and/or provide sounds, displays, and other physical output to the user based on operation of computing device 105.

The system can also include a network 115. The network 115 may can be any type of network familiar to those skilled in the art that can support data communications using any of a variety of commercially-available protocols, including without limitation Session Initiation Protocol (SIP), Transmission Control Protocol/Internet Protocol (TCP/IP), Systems Network Architecture (SNA), Internetwork Packet Exchange (IPX), AppleTalk, and the like. Merely by way of example, the network 115 maybe a Local Area Network (LAN), such as an Ethernet network, a Token-Ring network and/or the like; a wide-area network; a virtual network, including without limitation a Virtual Private Network (VPN); the Internet; an intranet; an extranet; a Public Switched Telephone Network (PSTN); an infra-red network; a wireless network (e.g., a network operating under any of the IEEE 802.11 suite of protocols, the Bluetooth® protocol known in the art, and/or any other wireless protocol); and/or any combination of these and/or other networks.

For example, the network 115 can comprise a wireless and/or wired home network with which the computing device 105 can be connected and as known in the art. According to one embodiment, the input/output device 110 can be wired or wireless connected with the computing device 105 and thus, can access the network 115 and/or be accessed from the network 115 through the computing device 105. Additionally, or alternatively, the input/output device 110 may be adapted to directly connect with the network 115, e.g., wirelessly through WiFi, Bluetooth, etc. The system 100 can further include one or more other computing devices 120 coupled with the network 115. These other computing devices 120, as with computing device 105 can comprise a laptop, desktop, or other personal computer, a gaming system, a tablet computer, etc., and/or a wide variety of other electronic devices including, but not limited to, a smart television, a television STB and/or DVR, a network interface device such as a "stick," "cube," or similar device, for example, coupled with a television, a controller for a home security system, an entertainment system, and/or a smart home control system, etc. Through the network 115, the input device 110 can access or be accessed by any one or more of such computing devices 120 and, for example, provide control or other input signals to the computing devices 120 and/or receive and play out and/or display audio and/or visual alerts, messages, etc.

The system 100 may also include one or more servers 125 or other computers communicatively coupled with the network 115. These server(s) 125 can comprise, for example, web servers, mail servers, application servers, and/or others as known in the art. According to one embodiment, the server(s) 125 can provide services related to the use of the input device 110. For example, the server(s) 125 can maintain appropriate device driver software for use of the input device 110 by the various computing devices 105 and/or 120 which may be accessed by and downloaded to the computing devices 105 and/or 120 when the input device 110 is installed for use with those devices 105 and/or 120. Additionally, or alternatively, the server(s) 125 may maintain and provide access to software for execution by one or more processors within the input device 110. Such software may, for example, provide, enhance, or update communications abilities of the input device 110, e.g., to allow use with new or different computing devices 105 and/or 120, provide new or additional access to functions of such devices 105 and/or 120, etc. Using methods as known in the art, such software can be requested by or through the input device 110 and/or computing devices 105 and/or 120 and provided by the server(s) 125 to the input device 110 over the network 115 in response to such requests. Additionally, or alternatively, such software may be pushed by the server(s) 125 to the input device 110 over the network 115 and possibly through the computing device(s) 105 and/or 120, depending upon the exact implementation, periodically or as it becomes available using methods as known in the art.

Figure 2:
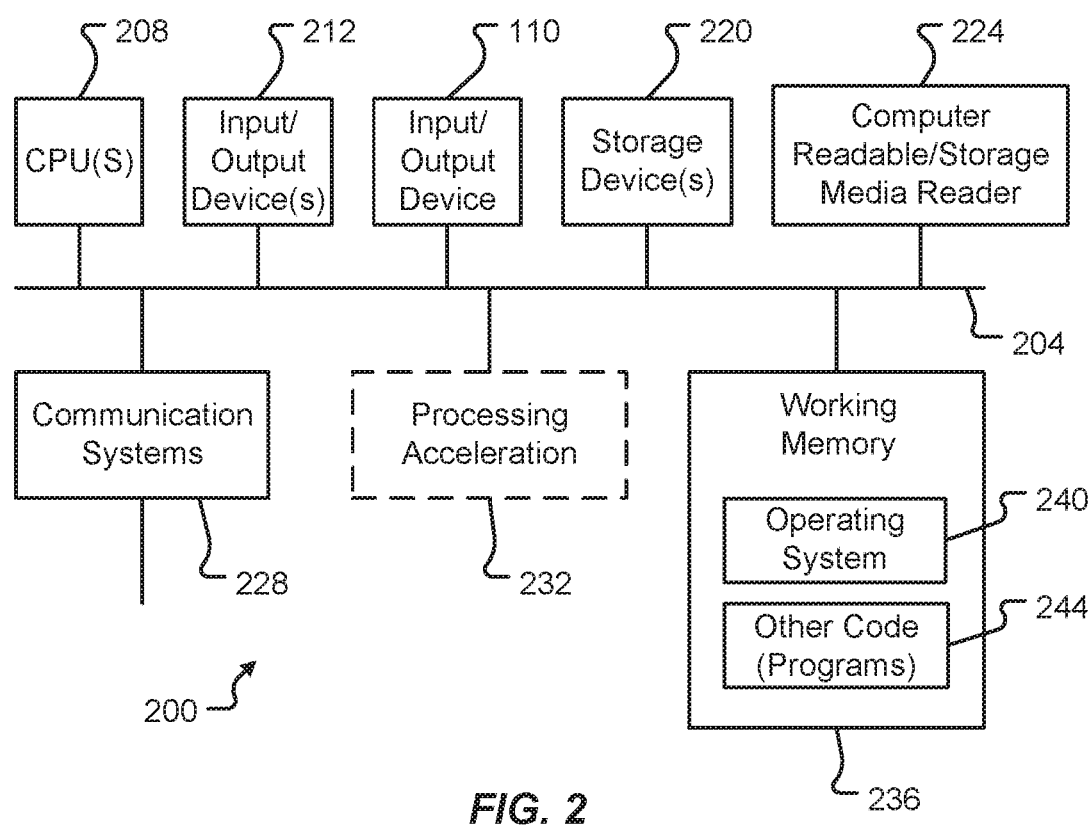
FIG. 2 is a block diagram illustrating elements of an exemplary computing device with which embodiments of the present disclosure may be implemented.

FIG. 2 is a block diagram illustrating elements of an exemplary computing device in which embodiments of the present disclosure may be implemented. More specifically, this example illustrates one embodiment of a computer system 200 as may be used to implement one or more of the computing devices 105 and/or 120 as described above. The computer system 200 is shown comprising hardware elements that may be electrically coupled via a bus 204. The hardware elements may include one or more Central Processing Units (CPUs) 208; one or more input/output devices 212, e.g., a mouse, a keyboard, a display device, a printer, etc. The system may also include, or be connected with, an input device 110 as described herein. The computer system 200 may also include one or more storage devices 220. By way of example, storage device(s) 220 may be disk drives, optical storage devices, solid-state storage devices such as a Random-Access Memory (RAM) and/or a Read-Only Memory (ROM), which can be programmable, flash-updateable and/or the like.

The computer system 200 may additionally include a computer-readable storage media reader 224; a communications system 228 (e.g., a modem, a network card (wireless or wired), an infra-red communication device, etc.); and working memory 236, which may include RAM and ROM devices as described above. The computer system 200 may also include a processing acceleration unit 232, which can include a Digital Signal Processor (DSP), a special-purpose processor, and/or the like.

The computer-readable storage media reader 224 can further be connected to a computer-readable storage medium, together (and, optionally, in combination with storage device(s) 220) comprehensively representing remote, local, fixed, and/or removable storage devices plus storage media for temporarily and/or more permanently containing computer-readable information. The communications system 228 may permit data to be exchanged with a network and/or any other computer described above with respect to the computer environments described herein. Moreover, as disclosed herein, the term "storage medium" may represent one or more devices for storing data, including ROM, RAM, magnetic RAM, core memory, magnetic disk storage mediums, optical storage mediums, flash memory devices and/or other machine-readable mediums for storing information.

The computer system 200 may also comprise software elements, shown as being currently located within a working memory 236, including an operating system 240 and/or other code 244. It should be appreciated that alternate embodiments of a computer system 200 may have numerous variations from that described above. For example, customized hardware might also be used and/or particular elements might be implemented in hardware, software (including portable software, such as applets), or both. Further, connection to other computing devices such as network input/output devices may be employed.

Examples of the processors 208 as described herein may include, but are not limited to, at least one of Qualcomm® Snapdragon® 800 and 801, Qualcomm® Snapdragon® 620 and 615 with 4G LTE Integration and 64-bit computing, Apple® A7 processor with 64-bit architecture, Apple® M7 motion coprocessors, Samsung® Exynos® series, the Intel® Core™ family of processors, the Intel® Xeon® family of processors, the Intel® Atom™ family of processors, the Intel Itanium® family of processors, Intel® Core® i5-4670K and i7-4770K 22 nm Haswell, Intel® Core® i5-3570K 22 nm Ivy Bridge, the AMD® FX™ family of processors, AMD® FX-4300, FX-6300, and FX-8350 32 nm Vishera, AMD® Kaveri processors, Texas Instruments® Jacinto C6000™ automotive infotainment processors, Texas Instruments® OMAP™ automotive-grade mobile processors, ARM® Cortex™-M processors, ARM® Cortex-A and ARM926EJ-S™ processors, other industry-equivalent processors, and may perform computational functions using any known or future-developed standard, instruction set, libraries, and/or architecture.

Figure 3:
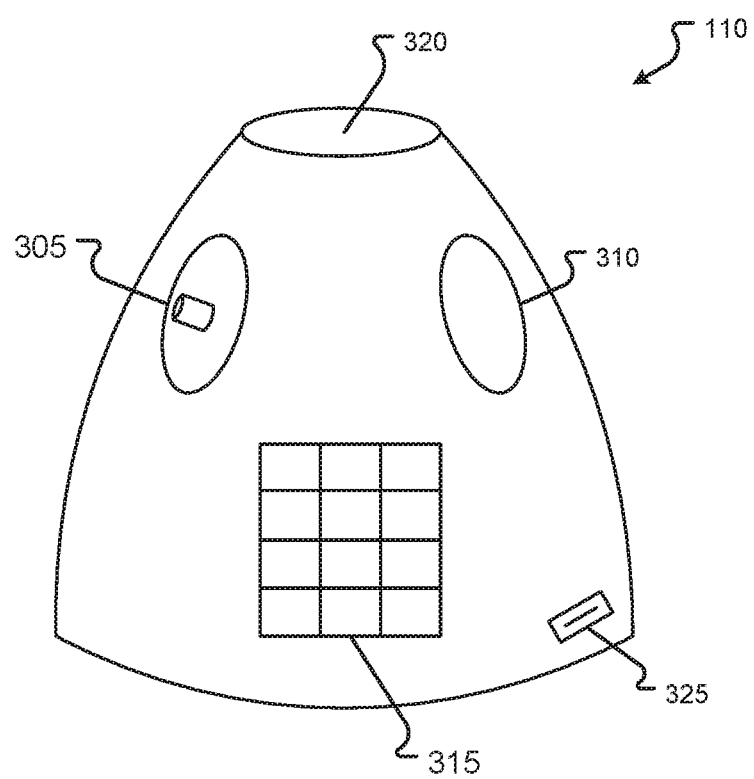
FIG. 3 is an isometric side view of an input/output device according to one embodiment of the present disclosure.

FIG. 3 is an isometric side view of an input/output device according to one embodiment of the present disclosure. As introduced above, the input/output device 110 can comprise a conically-shaped, handheld device which can be ergonomically adaptable as will be described in greater detail below. More specifically the input/output device can comprise a hemispherical, elliptical structure resembling an American football cut in half laterally, i.e., along a plane that is substantially perpendicular to the threads. Thus, the input/output device comprises a substantially circular base portion, a substantially conical-shaped enclosure coupled with and extending from the base portion, the base portion and enclosure together forming an elliptical, hemi-spherically shaped structure. One or more input devices can be disposed on a surface of the input/output device 110. As illustrated in this example, the input devices can include, but are not limited to, a joystick 305, a touch pad 310, a numeric keypad 315, etc. One or more output devices 320 can be disposed on a surface of the enclosure at an end of the elliptical, hemi-spherical structure opposite the base portion. The one or more output devices can include, but are not limited to a speaker, a display, or other device. As also illustrated here, the input/output device 110 can comprise a communications port 325 providing a wired interface to the input/output device 110. For example, the interface can comprise a Universal Serial Bus (USB) or similar interface.

Figure 4:
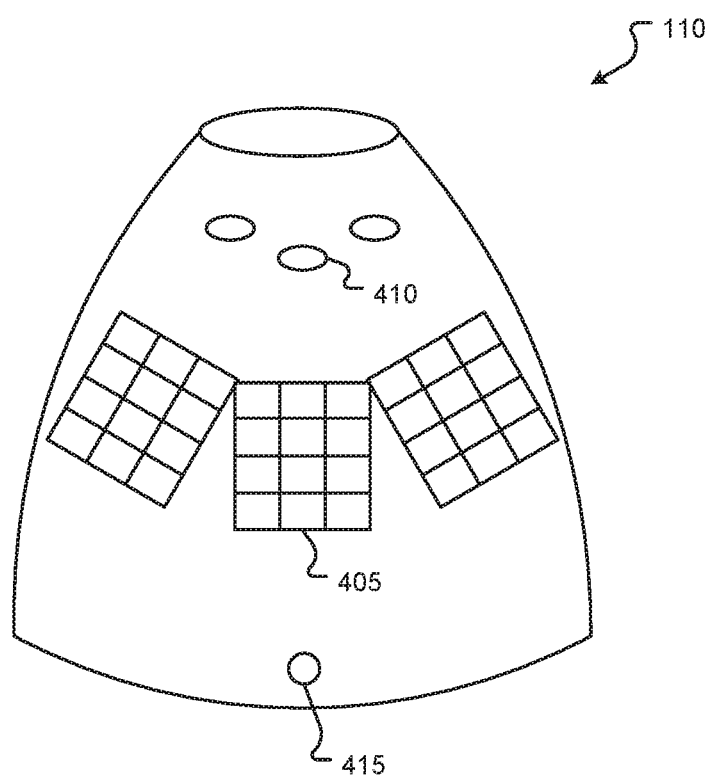
FIG. 4 is another isometric side view of an input/output device according to one embodiment of the present disclosure.

FIG. 4 is another isometric side view of an input/output device according to one embodiment of the present disclosure. More specifically, this example, illustrates additional or alternative details of input/output device 110 as illustrated in FIG. 3. For example, FIG. 4 can comprise a view of the input/output device 110 of FIG. 3 when rotated 180 degrees about an axis extending from the base portion through a center of the input/output device 110. However, in other cases, this example may represent an alternative to the example illustrated in FIG. 4. In either case, this example illustrates the input/output device 110 having a number of input devices mounted thereon. For example, the input devices can comprise a keyboard 405 such as a full or partial QWERTY keyboard, and a number of buttons 410. In some cases, the functions of these buttons 410 can depend upon the computer system, gaming system, or electronic device the input/output device 110 is coupled with. Additionally, or alternatively, the function of these buttons 410 may be configurable by a user of the input/output device 110.

As noted above, the input/output device 110 can be adaptable to ergonomically accommodate various users. More specifically, and as will be described in greater detail below, the input/output device 110 can include, within the enclosure, a set of one or more air bladders or chambers which allow the size and/or shape of the input/output device 110 based on the air pressure within the air bladders or chambers. Accordingly, in such embodiment, the input/output device 110 can comprise an air valve 415 disposed on an outside of the enclosure and connected with the air bladders or chambers to allow a user to vary the pressure within, e.g., using a pump, air compressor, canned compressed air, etc. For example, the air valve 415 can comprise a valve such as typically found on a football or, in another case, such as found on a bicycle inner tube.

It should be noted and understood that the embodiments illustrated in FIGS. 3 and 4 and described above are offered as non-limiting examples only and a wide variety of adaptations can be made to the input-output device without departing from the scope of the present disclosure. For example, the number and/or types of input and/or output devices, the location of each, the exact type, location, and number of communication ports (if any), air valves, etc. can all differ depending upon the exact implementation. Any such variations are considered to be wholly within the scope of the present disclosure.

Figure 5:
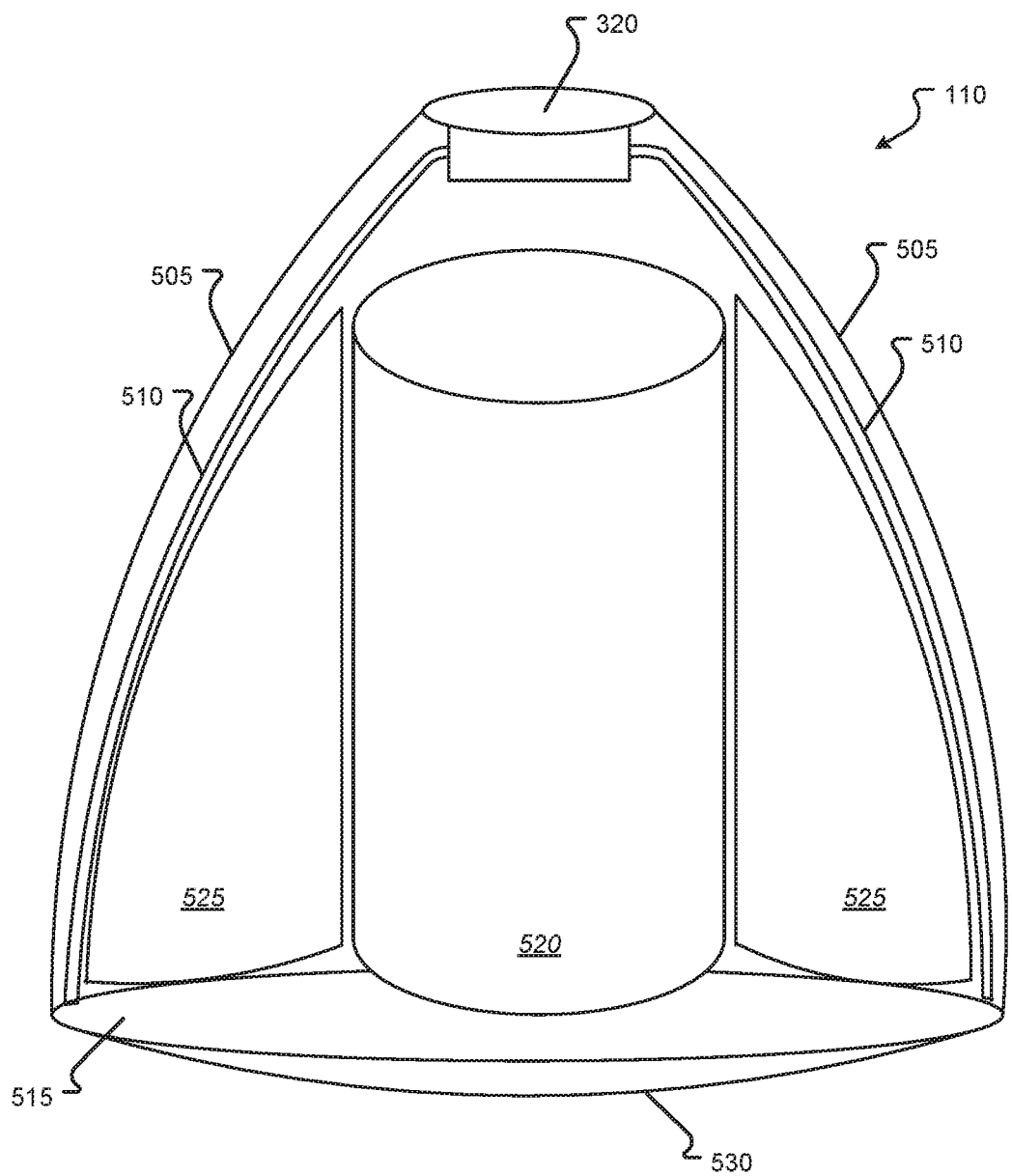
FIG. 5 is a cross-sectional side view of an input/output device according to one embodiment of the present disclosure.

FIG. 5 is a cross-sectional side view of an input/output device according to one embodiment of the present disclosure. As illustrated in this example, the enclosure of the input/output device 110 can comprise a shell material 505 covering an expandable supporting structure 510. The shell material 505 can comprise any of a variety of materials providing elasticity to allow for changes in the size and/or shape of the input/output device 110 while also providing a comfortable, non-slip surface for the user to grasp. For example, the shell material can comprise neoprene, spandex, or other material with similar elastic properties. Such material may be used alone or in combination with another material. For example, a spandex or neoprene material may be laminated or otherwise combined with a faux leather or other such material providing certain aesthetics, an appealing texture or other property. If such other material does not provide sufficient elasticity to allow the appropriate range of change in the size and/or shape of the input/output device 110, it may be applied in strips or overlaying panels, with accordion-style expansion bellows sections, or otherwise arranged to allow for expansion of the input/output device 110.

Together, the shell material 505 and the expandable supporting structure 510 can extend from the base 515 and form the enclosure of the input/output device 110. The base 515 can comprise a substantially circular portion of expandable material to allow for changes in the size and/or shape of the input/output device 110. As with the shell material, the material of the base 515 can comprise neoprene, spandex, or other material with similar elastic properties. Such material may be used alone or in combination with another material. For example, a spandex or neoprene material may be laminated or otherwise combined with a non-slip material such as silicone applied in dots, strips, panels, etc.

The expandable supporting structure 510 can comprise a metallic, composite, molded plastic or other structure providing rigidity while, at the same time, being moveable to allow for changes in the size and/or shape of the input/output device 110. Details of the expandable supporting structure will be described below with reference to FIG. 6. Generally speaking, it comprises a set of overlapping, hinged panels or plates that provide both the rigidity and expandability. The expandable supporting structure 510 can extend the distance from the base 515 to an opposite end of the input/output device 110 and may, in some cases, provide a mounting point and support for the output devices 320 (if any) located there. Additionally, the panels or plates of the expandable supporting structure 510 can provide mounting positions and support for input devices, output devices, communications ports, air valves, and any other elements of the input/output device 110 mounting or otherwise disposed on the surface of the enclosure.

Within the enclosure formed by the base 515, expandable supporting structure 510, and shell material 505 can be a central structure 520. The central structure 520 can extend from the base 515 to or near the portion of the expandable supporting structure 510 and provide support thereto by providing mounting points or supports (not shown here) onto which the expandable supporting structure 510 can be affixed. Generally speaking, the central structure 520 can comprise a substantially cylindrical housing into which various electronic components may be mounted. For example, the central structure can house a Printed Circuit Board (PCB) comprising a processor, memory, interface circuits, wireless transceivers, batteries and/or other components for operating the input/output device 110. Additional details of exemplary contents of the central structure are described below with reference to FIG. 7.

Between the center structure 520 and the expandable supporting structure 510 can be disposed one or more lateral air bladders 525. For example, the lateral air bladders can comprise a single bladder with a circular, central hole to accept the central structure 520 and which can encircle the central structure 520 when assembled. In such a case, the lateral air bladder 525 may comprise a single air cavity which, depending upon the air pressure therein, expand or contract the sides of the expandable supporting structure 510, thereby changing the size and/or shape of the input/output device 110. In other cases, the lateral air bladders 525 can comprise two or more air compartments similarly positioned between the central structure 520 and the expandable supporting structure 510. In such cases, and if the individual chambers have separate valves, the air pressure in the individual lateral air bladders 525 can be independently adjusted to alter the size and/or shape of the input/output device in an asymmetric manner, if so desired.

According to one embodiment, a base air bladder 530 may additionally or alternatively be disposed adjacent to and/or along the base 515 of the input/output device. For example, the base air bladder 530 can be disposed on a bottom of the central structure 520 and between the material of the base 515 and the central structure 520 and possibly the lateral air bladders 525 as well. In other cases, the base air bladder may comprise the material of the base 515 itself. In any of these cases, the base air bladder can be inflated or deflated to vary the contact area of the input/output device 110 with a surface it may be placed upon, such as a table. That is, based on the air pressure within the base air bladder 530, the base can be extended into an archical shape causing the input/output device to rock easily on the surface upon which it is placed. Such rocking may, in some implementations and when the input/output device is equipped with motion sensors, be used to generate and provide an input signal, e.g., to a gaming system. When the base air bladder 530 is deflated, the base 515 can be substantially flat allowing the input/output device 110 to rest flat and stable on a surface onto which it is placed.

Figure 6:
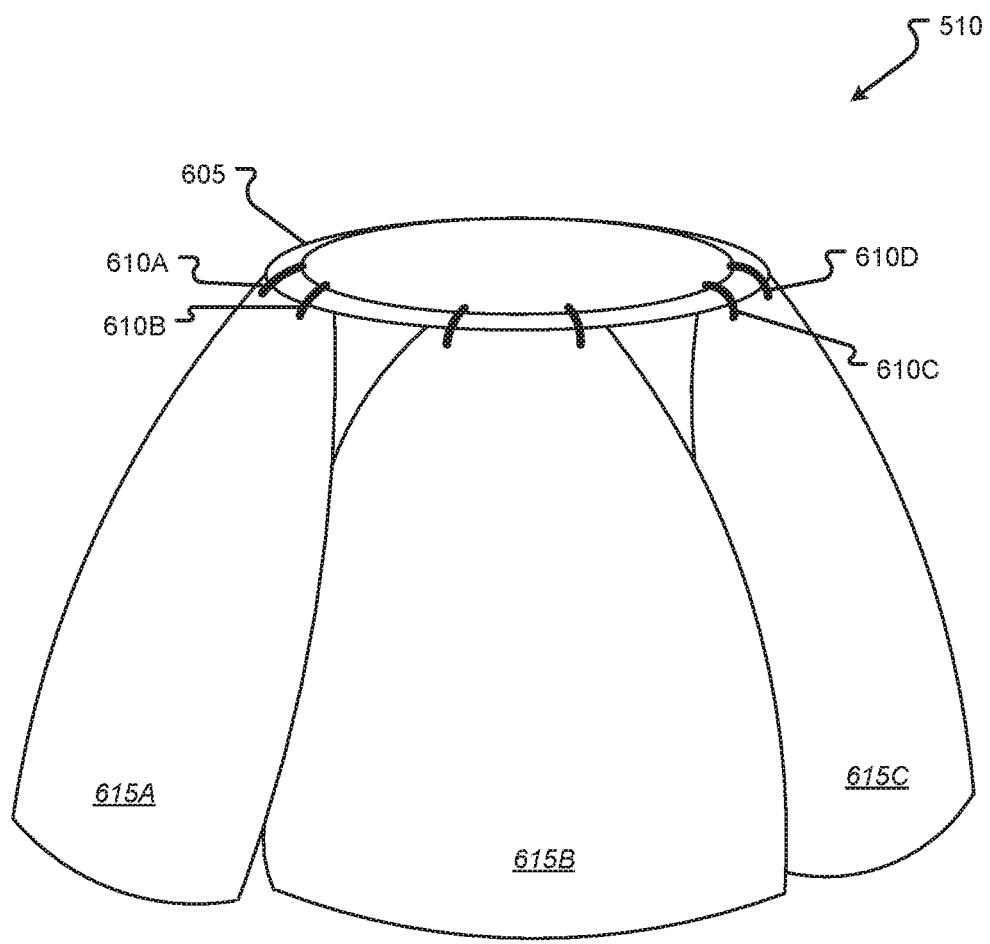
FIG. 6 is an isometric view of an expandable supporting structure of an input/output device according to one embodiment of the present disclosure.

FIG. 6 is an isometric view of an expandable supporting structure of an input/output device according to one embodiment of the present disclosure. As illustrated in this example, the expandable supporting structure 510 can comprise a central retainer 605. This central retainer can comprise, for example, a substantially circular plate which may be mounted onto the central 520 structure and/or onto which one or more output devices can be mounted. In another embodiment, the central retainer 605 can comprise a substantially circular ring which may be placed around the central structure 520.

In either case, a set of hinges 610A-610D can be disposed around an outside edge or circumference of the central retainer 605. The hinges 610A-610D can in turn be connected with a set of plates 615A-615C which comprise the sides of the expandable supporting structure 510 and which, when combined with the shell material 505 as described above, form the enclosure of the input/output device 110. Each plate 615A-615C can comprise a petal, i.e., it can be narrow at the end closest to the central retainer 605 and wider at the opposite end. Each plate 615A-615C can also have some degree of arch laterally, i.e., in a direction substantially parallel to the central retainer 605, longitudinally, i.e., in a direction substantially perpendicular to the central retainer 605, or both. Each plate 615A can also overlap an adjacent plate. For example, plate 615A can overlap plate 615B which in turn overlaps plate 615C and so on around the expandable supporting structure 510. In this way, the plates 615A-615C can pivot relative to the central retainer 605 on the hinges 610A-610D and slide relative to each adjacent plate which the air bladders 525 inside of the expandable supporting structure 510 expand or contract with the air pressure therein.

Figure 7:
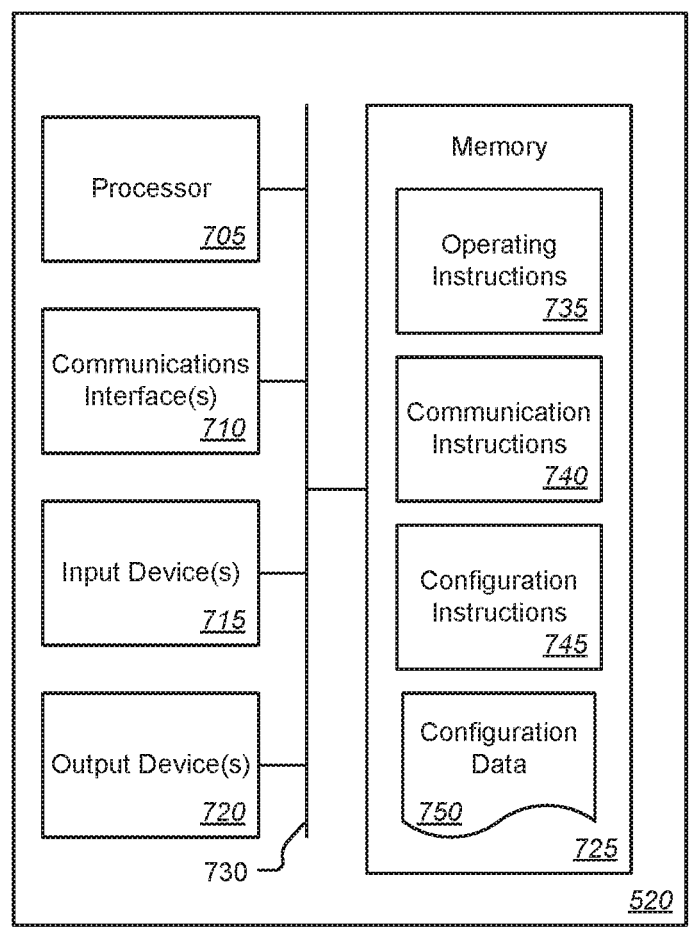
FIG. 7 is a block diagram illustrating exemplary electronic components of an input/output device according to one embodiment of the present disclosure.

FIG. 7 is a block diagram illustrating exemplary electronic components of an input/output device according to one embodiment of the present disclosure. As noted above, various electronic components of the input/output device 110 can be implemented in the central structural 520. As illustrated in this example and according to one embodiment, the components can include a processor 705 such as any of the processors described above or known in the art. The system can also include one or more communications interfaces 710 such as a wireless interface, e.g., Bluetooth, WiFi, etc., and/or a wired interface such as a USB or similar interface, one or more input devices 715, e.g., a motion sensor, pressure sensor, etc., or input module for an input device such as one or more buttons, a keypad, a keyboard, touch pad, mouse, joystick, microphone, etc., and one or more output devices 720 such as a haptic feedback device or output module for an output device such as a speaker, display, set of lights, etc. The processor 705 can be coupled with each of the communications interface(s) 710, input device(s) 715, and output device(s) 720 via a bus 730 such as known in the art.

Also coupled with the processor 705 can be a memory 725. The memory 725 can comprise any type of volatile and/or non-volatile memory as described above or known in the art. Additionally, the memory 725 can comprise sets of instructions stored therein which, when executed by the processor 705, cause the processor to perform various functions for operating and controlling the input/output device 110. For example, the memory 725 can store a set of operating instructions 735 which cause the processor 705 to perform the basic functions of the input/output device 110 such as power routines etc. as well as orchestrating and/or controlling the other functions. A set of communication instructions 740 stored in the memory can cause the processor 705 to detect and pair with a computer system, gaming system, or other device, register with a detected wired or wireless network, etc. A set of configuration instructions 745 can be stored in the memory 725 as well. When executed by the processor 705, the configuration instructions 745 can update a set of configuration data 750 for the input/output device 110. Such configuration data 750 can comprise information specific to a particular computer system, gaming system, or other electronic device that the input/output device is or can be paired with, user defined configurations for various buttons, keys, or other input and/or output devices of the input/output device 110 etc.

The present disclosure, in various aspects, embodiments, and/or configurations, includes components, methods, processes, systems, and/or apparatus substantially as depicted and described herein, including various aspects, embodiments, configurations embodiments, sub-combinations, and/or subsets thereof. Those of skill in the art will understand how to make and use the disclosed aspects, embodiments, and/or configurations after understanding the present disclosure. The present disclosure, in various aspects, embodiments, and/or configurations, includes providing devices and processes in the absence of items not depicted and/or described herein or in various aspects, embodiments, and/or configurations hereof, including in the absence of such items as may have been used in previous devices or processes, e.g., for improving performance, achieving ease and/or reducing cost of implementation.

The foregoing discussion has been presented for purposes of illustration and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as a separate preferred embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. An input/output device for a computer system, the input/output device comprising:
   a circular base portion;
   an enclosure coupled with and extending from the base portion, the enclosure forming a conically-shaped structure extending from the circular base;
   one or more input devices disposed on a surface of the enclosure;
   one or more inflatable air bladders disposed along an interior of the enclosure, wherein a change in a volume of air within the air bladders changes at least one of a size of the input/output device or a shape of the input/output device; and
   an interface coupled with each of the one or more input devices, the interface communicating input signals from the one or more input devices to the computer system.

2. The input/output device of claim 1, wherein the one or more input devices comprise a numeric keypad.

3. The input/output device of claim 1, wherein the one or more input devices comprise a QWERTY keyboard.

4. The input/output device of claim 1, wherein the one or more input devices comprise touchpad mouse.

5. The input/output device of claim 1, wherein the one or more input devices comprise a miniature joystick.

6. The input/output device of claim 1, further comprising one or more inflatable air bladders disposed along the base portion, wherein a change in a volume of air within the air bladders changes a shape of the base portion.

7. The input/output device of claim 1, further comprising one or more output devices disposed on a surface of the enclosure at an end of the input/output device opposite the base portion, the interface further coupled with each of the one or more output devices and communicating output signals from the computer system to the output devices.

8. The input/output device of claim 7, wherein the one or more output devices comprise a speaker.

9. The input/output device of claim 1, wherein the interface comprises a Universal Serial Bus (USB) interface.

10. The input/output device of claim 1, wherein the interface comprises a wireless communications interface and the input/output device further comprises:
    a processor coupled with the wireless communication interface, the one or more input devices, and the one or more output devices; and
    a memory coupled with and readable by the processor and storing therein a set of instructions which, when executed by the processor, causes the processor to pair with the computer system via the wireless communication interface.

11. A hand-held controller for a computer gaming system, the controller comprising:
    a circular base portion;
    an enclosure coupled with and extending from the base portion, the enclosure forming a conically-shaped structure extending from the circular base;
    a plurality of input devices disposed on a surface of the enclosure;
    one or more output devices disposed on a surface of the enclosure at an end of the controller opposite the base portion;
    one or more inflatable air bladders disposed along an interior of the enclosure, wherein a change in a volume of air within the air bladders changes at least one of a size of the input/output device or a shape of the input/output device; and
    an interface coupled with each input device of the plurality of input devices and each of the one or more output devices, the interface communicating input signals from the one or more input devices to the computer gaming system and output signals from the computer gaming system to the one or more output devices.

12. The controller of claim 11, further comprising one or more inflatable air bladders disposed along the base portion, wherein a change in a volume of air within the air bladders changes a shape of the base portion.

13. The controller of claim 11, wherein the one or more output devices comprise a speaker.

14. The controller of claim 11, wherein the one or more output devices comprise a haptic transducer.

15. The controller of claim 11, wherein the one or more output devices comprise one or more lights.

16. The controller of claim 11, wherein the one or more output devices comprise a display.

17. The controller of claim 11, wherein the plurality of input devices comprises a plurality of buttons.

18. The controller of claim 11, wherein the plurality of input devices comprises a mini joystick.

19. The controller of claim 11, wherein the plurality of input devices comprises a pressure sensor.

20. The controller of claim 11, wherein the plurality of input devices comprises a motion sensor.

\* \* \* \* \*